United States Patent
Byun

(10) Patent No.: US 7,238,552 B2
(45) Date of Patent: Jul. 3, 2007

(54) METHOD AND APPARATUS FOR DEPOSITING TUNGSTEN AFTER SURFACE TREATMENT TO IMPROVE FILM CHARACTERISTICS

(75) Inventor: Jeong Soo Byun, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/130,515

(22) Filed: May 17, 2005

(65) Prior Publication Data

US 2005/0208763 A1    Sep. 22, 2005

Related U.S. Application Data

(63) Continuation of application No. 10/196,514, filed on Jul. 15, 2002, now Pat. No. 6,936,538.

(60) Provisional application No. 60/305,765, filed on Jul. 16, 2001.

(51) Int. Cl.
    *H01L 21/82* (2006.01)
(52) U.S. Cl. ............... 438/126; 438/127; 257/E23.119
(58) Field of Classification Search ................ 438/126, 438/127
    See application file for complete search history.

(56) References Cited

U.S. PATENT DOCUMENTS

| | | |
|---|---|---|
| 4,486,487 A | 12/1984 | Skarp |
| 4,951,601 A | 8/1990 | Maydan et al. |
| 5,306,666 A | 4/1994 | Izumi |
| 5,374,570 A | 12/1994 | Nasu et al. |
| 5,526,244 A | 6/1996 | Bishop |

(Continued)

FOREIGN PATENT DOCUMENTS

| EP | 1 167 569 | 1/2002 |
|---|---|---|

(Continued)

OTHER PUBLICATIONS

George, et al. "Surface Chemistry for Atomic Layer Growth," J. Phys. Chem. 1996, 100, 13121-13131.

(Continued)

*Primary Examiner*—Fernando L. Toledo
(74) *Attorney, Agent, or Firm*—Patterson & Sheridan, LLP

(57) ABSTRACT

A method and system to form a refractory metal layer over a substrate includes introduction of a reductant, such as $PH_3$ or $B_2H_6$, followed by introduction of a tungsten containing compound, such as $WF_6$, to form a tungsten layer. It is believed that the reductant reduces the fluorine content of the tungsten layer while improving the step coverage and resistivity of the tungsten layer. It is believed that the improved characteristics of the tungsten film are attributable to the chemical affinity between the reductants and the tungsten containing compound. The chemical affinity provides better surface mobility of the adsorbed chemical species and better reduction of $WF_6$ at the nucleation stage of the tungsten layer. The method can further include sequentially introducing a reductant, such as $PH_3$ or $B_2H_6$, and a tungsten containing compound to deposit a tungsten layer. The formed tungsten layer can be used as a nucleation layer followed by bulk deposition of a tungsten layer utilizing standard CVD techniques. Alternatively, the formed tungsten layer can be used to fill an aperture.

49 Claims, 10 Drawing Sheets

U.S. PATENT DOCUMENTS

| | | |
|---|---|---|
| 5,711,811 A | 1/1998 | Suntola et al. |
| 5,804,488 A | 9/1998 | Shih et al. |
| 5,834,372 A | 11/1998 | Lee |
| 5,916,365 A | 6/1999 | Sherman |
| 6,015,590 A | 1/2000 | Suntola et al. |
| 6,042,652 A | 3/2000 | Hyun et al. |
| 6,139,700 A | 10/2000 | Kang et al. |
| 6,156,382 A | 12/2000 | Rajagopalan et al. |
| 6,174,809 B1 | 1/2001 | Kang et al. |
| 6,197,683 B1 | 3/2001 | Kang et al. |
| 6,200,893 B1 | 3/2001 | Sneh |
| 6,203,613 B1 | 3/2001 | Gates et al. |
| 6,207,302 B1 | 3/2001 | Sugiura et al. |
| 6,207,487 B1 | 3/2001 | Kim et al. |
| 6,218,298 B1 | 4/2001 | Hoinkis |
| 6,270,572 B1 | 8/2001 | Kim et al. |
| 6,284,646 B1 | 9/2001 | Leem |
| 6,287,965 B1 | 9/2001 | Kang et al. |
| 6,305,314 B1 | 10/2001 | Sneh et al. |
| 6,333,260 B1 | 12/2001 | Kwon et al. |
| 6,335,280 B1 | 1/2002 | van der Jeugd |
| 6,342,277 B1 | 1/2002 | Sherman |
| 6,348,376 B2 | 2/2002 | Lim et al. |
| 6,355,561 B1 | 3/2002 | Sandhu et al. |
| 6,358,829 B2 | 3/2002 | Yoon et al. |
| 6,368,954 B1 | 4/2002 | Lopatin et al. |
| 6,369,430 B1 | 4/2002 | Adetutu et al. |
| 6,372,598 B2 | 4/2002 | Kang et al. |
| 6,391,785 B1 | 5/2002 | Satta et al. |
| 6,399,491 B2 | 6/2002 | Jeon et al. |
| 6,416,577 B1 | 7/2002 | Suntoloa et al. |
| 6,416,822 B1 | 7/2002 | Chiang et al. |
| 6,420,189 B1 | 7/2002 | Lopatin |
| 6,423,619 B1 | 7/2002 | Grant et al. |
| 6,428,859 B1 | 8/2002 | Chiang et al. |
| 6,447,933 B1 | 9/2002 | Wang et al. |
| 6,451,119 B2 | 9/2002 | Sneh et al. |
| 6,451,695 B2 | 9/2002 | Sneh |
| 6,458,701 B1 | 10/2002 | Chae et al. |
| 6,468,924 B2 | 10/2002 | Lee et al. |
| 6,475,276 B1 | 11/2002 | Elers et al. |
| 6,475,910 B1 | 11/2002 | Sneh |
| 6,478,872 B1 | 11/2002 | Chae et al. |
| 6,482,262 B1 | 11/2002 | Elers et al. |
| 6,482,733 B2 | 11/2002 | Raaijmakers et al. |
| 6,482,740 B2 | 11/2002 | Soininen et al. |
| 6,511,539 B1 | 1/2003 | Raaijmakers et al. |
| 6,534,395 B2 | 3/2003 | Werkhoven et al. |
| 6,548,424 B2 | 4/2003 | Putkonen |
| 6,551,929 B1 | 4/2003 | Kori et al. |
| 6,569,501 B2 | 5/2003 | Chiang et al. |
| 6,573,180 B2 | 6/2003 | Won |
| 6,576,565 B1 | 6/2003 | Chakravarti et al. |
| 6,596,636 B2 | 7/2003 | Sandhu et al. |
| 6,599,572 B2 | 7/2003 | Saanila et al. |
| 6,607,976 B2 | 8/2003 | Chen et al. |
| 6,620,723 B1 | 9/2003 | Byun et al. |
| 6,630,201 B2 | 10/2003 | Chiang et al. |
| 6,632,279 B1 | 10/2003 | Ritala et al. |
| 6,635,965 B1 | 10/2003 | Lee et al. |
| 6,660,126 B2 | 12/2003 | Nguyen et al. |
| 6,686,271 B2 | 2/2004 | Raaijmakers et al. |
| 6,790,773 B1 | 9/2004 | Drewery et al. |
| 6,815,285 B2 | 11/2004 | Choi et al. |
| 6,936,538 B2 | 8/2005 | Byun |
| 2001/0000866 A1 | 5/2001 | Sneh et al. |
| 2001/0002280 A1 | 5/2001 | Sneh |
| 2001/0009140 A1 | 7/2001 | Bondestam et al. |
| 2001/0009695 A1 | 7/2001 | Saanila et al. |
| 2001/0024387 A1 | 9/2001 | Raaijmakers et al. |
| 2001/0028924 A1 | 10/2001 | Sherman |
| 2001/0029094 A1 | 10/2001 | Mee-Young et al. |
| 2001/0034123 A1 | 10/2001 | Jeon et al. |
| 2001/0041250 A1 | 11/2001 | Werkhoven et al. |
| 2001/0050039 A1 | 12/2001 | Park |
| 2001/0054730 A1 | 12/2001 | Kim et al. |
| 2001/0054769 A1 | 12/2001 | Raaijmakers et al. |
| 2002/0000598 A1 | 1/2002 | Kang et al. |
| 2002/0004293 A1 | 1/2002 | Soininen et al. |
| 2002/0007790 A1 | 1/2002 | Park |
| 2002/0019121 A1 | 2/2002 | Pyo |
| 2002/0021544 A1 | 2/2002 | Cho et al. |
| 2002/0031618 A1 | 3/2002 | Sherman |
| 2002/0037630 A1 | 3/2002 | Agarwal et al. |
| 2002/0041931 A1 | 4/2002 | Suntola et al. |
| 2002/0048635 A1 | 4/2002 | Kim et al. |
| 2002/0048880 A1 | 4/2002 | Lee |
| 2002/0052097 A1 | 5/2002 | Park |
| 2002/0055235 A1 | 5/2002 | Agarwal et al. |
| 2002/0060363 A1 | 5/2002 | Xi et al. |
| 2002/0061612 A1 | 5/2002 | Sandhu et al. |
| 2002/0068458 A1 | 6/2002 | Chiang et al. |
| 2002/0073924 A1 | 6/2002 | Chiang et al. |
| 2002/0074588 A1 | 6/2002 | Lee |
| 2002/0076481 A1 | 6/2002 | Chiang et al. |
| 2002/0076507 A1 | 6/2002 | Chiang et al. |
| 2002/0076508 A1 | 6/2002 | Chiang et al. |
| 2002/0076837 A1 | 6/2002 | Hujanen et al. |
| 2002/0081844 A1 | 6/2002 | Jeon et al. |
| 2002/0086111 A1 | 7/2002 | Byun et al. |
| 2002/0086507 A1 | 7/2002 | Park et al. |
| 2002/0090829 A1 | 7/2002 | Sandhu et al. |
| 2002/0094689 A1 | 7/2002 | Park |
| 2002/0104481 A1 | 8/2002 | Chiang et al. |
| 2002/0105088 A1 | 8/2002 | Yang et al. |
| 2002/0106536 A1 | 8/2002 | Lee et al. |
| 2002/0106846 A1 | 8/2002 | Seutter et al. |
| 2002/0109168 A1 | 8/2002 | Kim et al. |
| 2002/0117399 A1 | 8/2002 | Chen et al. |
| 2002/0121241 A1 | 9/2002 | Nguyen et al. |
| 2002/0121697 A1 | 9/2002 | Marsh |
| 2002/0135071 A1 | 9/2002 | Kang et al. |
| 2002/0144655 A1 | 10/2002 | Chiang et al. |
| 2002/0144657 A1 | 10/2002 | Chiang et al. |
| 2002/0146511 A1 | 10/2002 | Chiang et al. |
| 2002/0155722 A1 | 10/2002 | Satta et al. |
| 2002/0162506 A1 | 11/2002 | Sneh et al. |
| 2002/0164421 A1 | 11/2002 | Chiang et al. |
| 2002/0164423 A1 | 11/2002 | Chiang et al. |
| 2002/0177282 A1 | 11/2002 | Song |
| 2002/0182320 A1 | 12/2002 | Leskela et al. |
| 2002/0187256 A1 | 12/2002 | Elers et al. |
| 2002/0187631 A1 | 12/2002 | Kim et al. |
| 2002/0197402 A1 | 12/2002 | Chiang et al. |
| 2002/0197863 A1 | 12/2002 | Mak et al. |
| 2003/0013300 A1 | 1/2003 | Byun |
| 2003/0013320 A1 | 1/2003 | Kim et al. |
| 2003/0031807 A1 | 2/2003 | Elers et al. |
| 2003/0032281 A1 | 2/2003 | Werkhoven et al. |
| 2003/0042630 A1 | 3/2003 | Babcoke et al. |
| 2003/0049931 A1 | 3/2003 | Byun et al. |
| 2003/0049942 A1 | 3/2003 | Haukka et al. |
| 2003/0053799 A1 | 3/2003 | Lei |
| 2003/0054631 A1 | 3/2003 | Raaijmakers et al. |
| 2003/0082296 A1 | 5/2003 | Elers et al. |
| 2003/0082300 A1 | 5/2003 | Todd et al. |
| 2003/0082301 A1 | 5/2003 | Chen et al. |
| 2003/0089308 A1 | 5/2003 | Raaijmakers |
| 2003/0101927 A1 | 6/2003 | Raaijmakers |
| 2003/0104126 A1 | 6/2003 | Fang et al. |
| 2003/0116087 A1 | 6/2003 | Nguyen et al. |
| 2003/0121241 A1 | 7/2003 | Belke |
| 2003/0121342 A1 | 7/2003 | Buri |
| 2003/0123216 A1 | 7/2003 | Yoon et al. |

| | | | |
|---|---|---|---|
| 2003/0129826 A1 | 7/2003 | Werkhoven et al. | |
| 2003/0134508 A1 | 7/2003 | Raaijmakers et al. | |
| 2003/0143328 A1 | 7/2003 | Chen et al. | |
| 2003/0143839 A1 | 7/2003 | Raaijmakers et al. | |
| 2003/0143841 A1 | 7/2003 | Yang et al. | |
| 2003/0153181 A1 | 8/2003 | Yoon et al. | |
| 2003/0161952 A1 | 8/2003 | Wang et al. | |
| 2003/0165615 A1 | 9/2003 | Aaltonen et al. | |
| 2003/0168750 A1 | 9/2003 | Basceri et al. | |
| 2003/0173586 A1 | 9/2003 | Moriwaki et al. | |
| 2003/0186495 A1 | 10/2003 | Saanila et al. | |
| 2003/0190423 A1 | 10/2003 | Yang et al. | |
| 2003/0190804 A1 | 10/2003 | Glenn et al. | |
| 2003/0194493 A1 | 10/2003 | Chang et al. | |
| 2003/0194825 A1 | 10/2003 | Law et al. | |
| 2003/0203616 A1 | 10/2003 | Chung et al. | |
| 2003/0205729 A1 | 11/2003 | Basceri et al. | |
| 2003/0224217 A1 | 12/2003 | Byun et al. | |
| 2004/0005749 A1 | 1/2004 | Choi et al. | |
| 2004/0009307 A1 | 1/2004 | Koh et al. | |
| 2004/0011504 A1 | 1/2004 | Ku et al. | |
| 2004/0013577 A1 | 1/2004 | Ganguli et al. | |
| 2004/0014315 A1 | 1/2004 | Lai et al. | |
| 2004/0014320 A1 | 1/2004 | Chen et al. | |
| 2004/0015300 A1 | 1/2004 | Ganguli et al. | |
| 2004/0018304 A1 | 1/2004 | Chung et al. | |
| 2004/0018723 A1 | 1/2004 | Byun et al. | |
| 2004/0041320 A1 | 3/2004 | Hodumi | |
| 2005/0006799 A1 | 1/2005 | Gregg et al. | |

FOREIGN PATENT DOCUMENTS

| | | |
|---|---|---|
| GB | 2 355 727 A | 5/2001 |
| GB | 2 355 747 | 5/2001 |
| JP | 02-246161 | 10/1990 |
| JP | 07-300649 A | 11/1995 |
| JP | 2000-031387 | 1/2000 |
| JP | 2000-058777 | 2/2000 |
| JP | 2000-178735 | 6/2000 |
| JP | 2001-111000 | 12/2000 |
| JP | 10-308283 | 3/2001 |
| JP | 2001-172767 | 6/2001 |
| JP | 2001-220294 | 8/2001 |
| JP | 2001-254181 | 9/2001 |
| WO | WO 96/17107 | 6/1996 |
| WO | WO 98/51838 | 11/1998 |
| WO | WO 99/01595 | 1/1999 |
| WO | WO 99/29924 | 6/1999 |
| WO | WO 00/15865 | 3/2000 |
| WO | WO 00/16377 | 3/2000 |
| WO | WO 00/54320 | 9/2000 |
| WO | WO 00/63957 | 10/2000 |
| WO | WO 00/79576 | 12/2000 |
| WO | WO 01/15220 | 3/2001 |
| WO | WO 01/17692 | 3/2001 |
| WO | WO 01/27346 | 4/2001 |
| WO | WO 01/27347 | 4/2001 |
| WO | WO 01/29280 | 4/2001 |
| WO | WO 01/29891 | 4/2001 |
| WO | WO 01/29893 | 4/2001 |
| WO | WO 01/66832 | 9/2001 |
| WO | WO 02/01628 | 1/2002 |
| WO | WO 02/45167 | 6/2002 |
| WO | WO 02/45871 | 6/2002 |
| WO | WO 02/46489 | 6/2002 |
| WO | WO 02/067319 | 8/2002 |

OTHER PUBLICATIONS

Hwang, et al. Nanometer-Size α-PbO$_2$-Type TiO$_2$ in Garnet: A Thermobarometer for Ultrahigh-Pressure Metamorphism, SCIENCE vol. 288 Apr. 14, 2000.

Klaus, et al. "Atomic Layer Deposition of SiO$_2$ Using Catalyzed and Uncatalyzed Self-Limiting Surface Reactions," Surface Review and Letters, vol. 6, Nos. 3 & 4 (1999).

Klaus, et al. "Atomically Controlled Growth of Tungsten and Tungsten Nitride Using Sequential Surface Reactions," Applied Surface Science, 162-163 (2000) 479-491.

Lee, et al. "Pulsed Nucleation for Ultra-High Aspect Ratio Tungsten Plugfill," Materials Research Society, 2002, 649-653.

Martensson, et al. "Use of Atomic Layer Epitaxy for Fabrication of Si/TiN/Cu Structures," J. Vac. Sci. Technol. B. 17(5), Sep./Oct. 1999.

Min, et al. "Atomic Layer Deposition of TiN Thin Films by Sequential Introduction of Ti Precursor and NH3," Mat. Res. Soc. Symp. Proc. vol. 514 (1998).

Min, et al. "Chemical Vapor Deposition of Ti-Si-N Films With Alternating Source Supply," Mat. Rec. Soc. Symp. Proc. Vol. (1999).

Min, et al. "Metal-organic Atomic-layer Deposition of Titanium-silicon-nitride films," Applied Physics Letters, vol. 75, No. 11 (Sep. 13, 1999).

Niinisto, et al. "Synthesis of Oxide Thin Films and Overlayers by Atomic Layer Epitaxy for Advanced Applications," Materials Science and Engineering B41 (1996) 23-29.

Proceedings of the IEEE 1998 International Interconnect Technology Conference Digest of Technical Papers, Jun. 1998.

Ritala, et al. "Atomic Force Microscopy Study of Titanium Dioxide Thin Films Grown by Atomic Layer Epitaxy," Thin Solid Films, vol. 228, No. 1-2 (May 15, 1993), pp. 32-35.

Ritala, et al. "Atomic Layer Epitaxy Grown of TiN Thin Films from TiI$_4$ and NH$_3$," J. Electrochem. Soc., vol. 145, No. 8, Aug. 1998.

Ritala, et al. "Atomic Layer Epitaxy Growth of TiN Thin Films," J. Electrochem. Soc., vol. 142, No. 8, Aug. 1995.

Ritala, et al., "Effects of Intermediate Zinc Pulses on Properties of TiN and NbN Films Deposited by Atomic Layer Epitaxy," Applied Surface Science 120 (1997).

Ritala, et al. "Growth of Titanium Dioxide Thin Films by Atomic Layer Epitaxy," Thin Solid Films, vol. 225, No. 1-2 (Mar. 25, 1993) pp. 288-295.

Ritala, et al. "Perfectly Conformal TiN and Al$_2$O$_3$ Films Deposited by Atomic Layer Deposition," Chem. Vap. Deposition 1999, 5, No. 1.

Ritala, et al. "Surface Roughness Reduction in Atomic Layer Epitaxy Growth of Titanium Dioxide Thin Films," Thin Solid Films, 249 (1994).

Rossnagel, et al. "Plasma-enhanced Atomic Layer Deposition of Ta and Ti for Interconnect Diffusion Barriers," J. Vacuum Sci. & Tech. B., vol. 18, No. 4 (Jul. 2000), pp. 2016-2020.

Yang, et al. "Atomic Layer Deposition of Tungsten Film from WF$_6$/B$_2$H$_6$: Nucleation Layer for Advanced Semiconductor Devices," Conference Proceedings ULSI XVII (2002) Materials Research Society.

METHOD AND APPARATUS FOR DEPOSITING TUNGSTEN AFTER SURFACE TREATMENT TO IMPROVE FILM CHARACTERISTICS

CROSS-REFERENCE TO RELATED APPLICATIONS

This application is a continuation of U.S. Ser. No. 10/196,514, filed Jul. 15, 2002, and issued as U.S. Pat. No. 6,936,538, which claims benefit of U.S. Ser. No. 60/305,765, filed Jul. 16, 2001, which are both herein incorporated by reference.

BACKGROUND OF THE INVENTION

1. Field of the Invention

Embodiments of the invention relate to the processing of semiconductor substrates. More particularly, embodiments of the invention relate to improvements in the process of depositing refractory metal layers on semiconductor substrates.

2. Description of the Related Art

The semiconductor processing industry continues to strive for larger production yields while increasing the uniformity of layers deposited on substrates having larger surface areas. These same factors in combination with new materials also provide higher density of circuits per unit area of the substrate. As circuit density increases, the need for greater uniformity and process control regarding layer thickness rises. As a result, various technologies have been developed to deposit layers on substrates in a cost-effective manner, while maintaining control over the characteristics of the layer. Chemical vapor deposition (CVD) is one of the most common deposition processes employed for depositing layers on a substrate. CVD is a flux-dependent deposition technique that requires precise control of the substrate temperature and precursors introduced into the processing chamber in order to produce a desired layer of uniform thickness. These requirements become more critical as substrate size increases (e.g., from 200 mm diameter substrates to 300 mm substrates), creating a need for more complexity in chamber design and gas flow technique to maintain adequate uniformity.

A variant of CVD that demonstrates superior step coverage compared to CVD, is atomic layer deposition (ALD). ALD is based upon atomic layer epitaxy (ALE) that was employed originally to fabricate electroluminescent displays. ALD employs chemisorption to deposit a saturated monolayer of reactive precursor molecules on a substrate surface by alternating pulses of an appropriate reactive precursor into a deposition chamber. Each injection of a reactive precursor is separated by an inert gas purge to provide an adsorbed atomic layer to previously deposited layers to form a uniform layer on the substrate. The cycle is repeated to form the layer to a desired thickness. A drawback with ALD techniques is that the deposition rate is much lower than typical CVD techniques by at least one order of magnitude.

Formation of film layers at a high deposition rate while providing adequate step coverage are conflicting characteristics often necessitating sacrificing one to obtain the other. This conflict is true particularly when refractory metal layers are deposited to cover apertures or vias during formation of contacts that interconnect adjacent metallic layers separated by dielectric layers. Historically, CVD techniques have been employed to deposit conductive material such as refractory metals in order to inexpensively and quickly fill vias. Due to the increasing density of semiconductor circuitry, tungsten has been used based upon superior step coverage to fill these high aspect ratio structures. As a result, deposition of tungsten employing CVD techniques enjoys wide application in semiconductor processing due to the high throughput of the process and good step coverage.

Depositing tungsten by traditional CVD methods, however, is attendant with several disadvantages. For example, blanket deposition of a tungsten layer on a semiconductor wafer is time-consuming at temperatures below 400° C. The deposition rate of tungsten may be improved by increasing the deposition temperature between approximately 500° C. to 550° C. However, temperatures in this higher range may compromise the structural and operational integrity of the underlying portions of the integrated circuit being formed. Use of tungsten has also complicated photolithography steps during the manufacturing process as it results in a relatively rough surface having a reflectivity of 20% or less than that of a silicon substrate. Finally, tungsten has proven difficult to uniformly deposit on a substrate. Variance in film thickness of greater than 1% has been shown, thereby causing poor control of the resistivity of the layer. Several prior attempts to overcome the aforementioned drawbacks have been attempted.

For example, in U.S. Pat. No. 5,028,565 to Chang et al., which is assigned to the assignee of the present invention, a method is disclosed to improve, inter alia, uniformity of tungsten layers by varying the deposition chemistry. The method includes, in pertinent part, formation of a nucleation layer over an intermediate barrier layer before depositing the tungsten layer via bulk deposition. The nucleation layer is formed from a gaseous mixture of tungsten hexafluoride, hydrogen, silane and argon. The nucleation layer is described as providing a layer of growth sites to promote uniform deposition of a tungsten layer thereon. The benefits provided by the nucleation layer are described as being dependent upon the barrier layer present. For example, the uniformity of a tungsten layer is improved by as much as 15% when formed on a titanium nitride barrier layer. The benefits provided by the nucleation layer are not as pronounced if the barrier layer formed from sputtered tungsten or sputtered titanium tungsten.

A need exists, therefore, to provide techniques to improve the characteristics of refractory metal layers deposited on semiconductor substrates.

SUMMARY OF THE INVENTION

A method and system to form a refractory metal layer over a substrate includes introduction of a reductant, such as $PH_3$ or $B_2H_6$, followed by introduction of a tungsten containing compound, such as $WF_6$, to form a tungsten layer. It is believed that the reductant reduces the fluorine content of the tungsten layer while improving the step coverage and resistivity of the tungsten layer. It is believed that the improved characteristics of the tungsten film are attributable to the chemical affinity between the reductants and the tungsten containing compound. The chemical affinity provides better surface mobility of the adsorbed chemical species and better reduction of $WF_6$ at the nucleation stage of the tungsten layer.

The method can further include sequentially introducing a reductant, such as $PH_3$ or $B_2H_6$, and a tungsten containing compound to deposit a tungsten layer. The formed tungsten layer can be used as a nucleation layer followed by bulk deposition of a tungsten layer utilizing standard CVD techniques. Alternatively, the formed tungsten layer can be used to fill an aperture.

DETAILED DESCRIPTION

Figure 1:
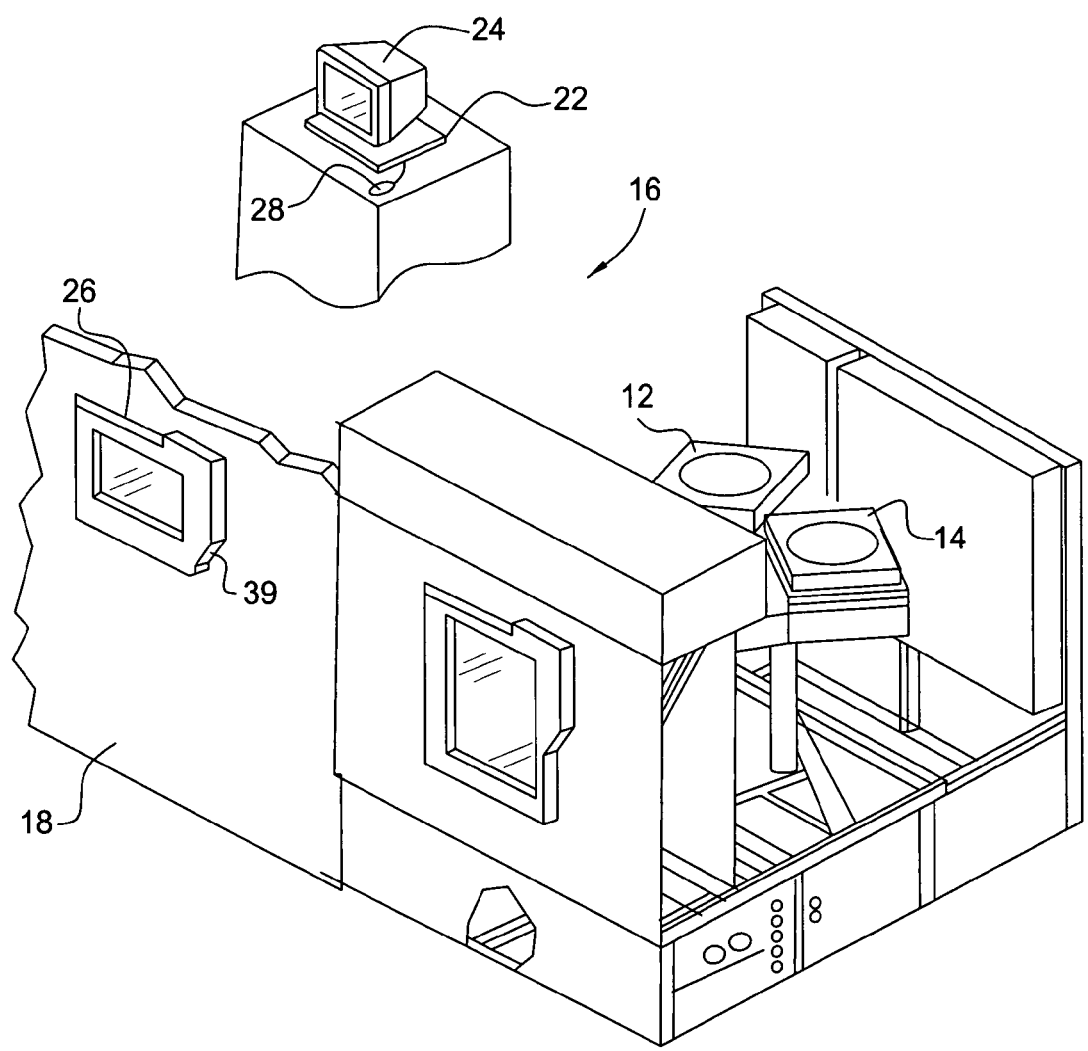
FIG. 1 is a perspective view of one embodiment of a semiconductor processing system in accordance with the present invention.

Referring to FIG. 1, an exemplary wafer processing system includes one or more processing chambers 12 and 14 disposed in a common work area 16 surrounded by a wall 18. Processing chambers 12 and 14 are in data communication with a controller 22 that is connected to one or more monitors, shown as 24 and 26. The monitors typically display common information concerning the process associated with processing chambers 12 and 14. One of the monitors 26 is mounted on wall 18, with the remaining monitor 24 being disposed in work area 16. Operational control of processing chambers 12 and 14 may be achieved by the use of a light pen, associated with one of the monitors 24 and 26, to communicate with controller 22. For example, light pen 28 is associated with monitor 24 and facilitates communication with controller 22 through monitor 24. Light pen 39 facilitates communication with controller 22 through monitor 26.

Figure 2:
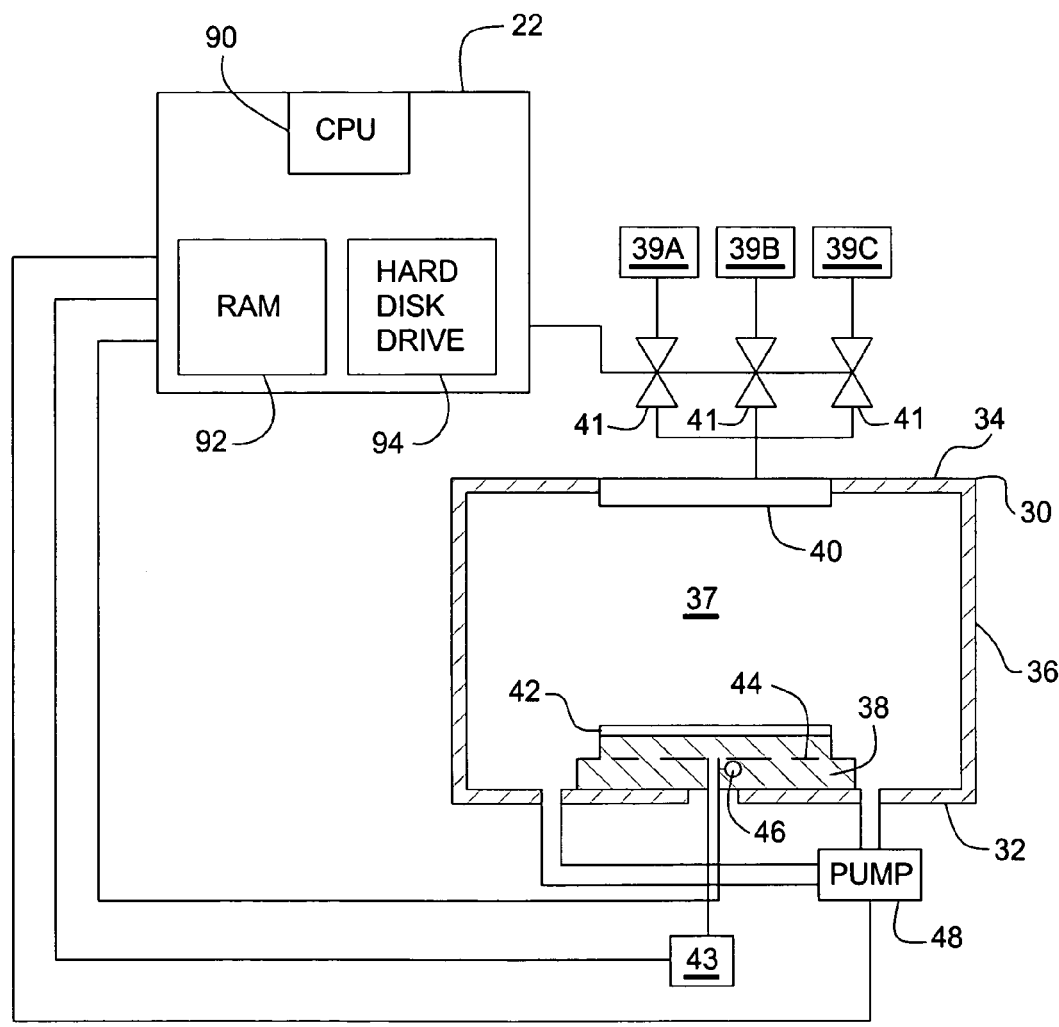
FIG. 2 is a schematic cross-sectional view of one embodiment of the processing chambers shown above in FIG. 1.

Referring both to FIGS. 1 and 2, each of processing chambers 12 and 14 includes a housing 30 having a base wall 32, a cover 34 disposed opposite to base wall 32, and a sidewall 36 extending therebetween. Housing 30 defines a chamber 37, and a pedestal 38 is disposed within processing chamber 37 to support a substrate 42, such as a semiconductor wafer. Pedestal 38 may be mounted to move between cover 34 and base wall 32, using a displacement mechanism (not shown), but the position thereof is typically fixed. Supplies of processing gases 39a, 39b and 39c are in fluid communication with processing chamber 37 via a showerhead 40. Regulation of the flow of gases from supplies 39a, 39b and 39c is effectuated via flow valves 41.

Depending on the specific process, substrate 42 may be heated to a desired temperature prior to layer deposition via a heater embedded within pedestal 38. For example, pedestal 38 may be resistively heated by applying an electric current from AC power supply 43 to heater element 44. Substrate 42 is, in turn, heated by pedestal 38, and can be maintained within a desired process temperature range of, for example, about 20° C. to about 750° C. A temperature sensor 46, such as a thermocouple, is also embedded in wafer support pedestal 38 to monitor the temperature of pedestal 38 in a conventional manner. For example, the measured temperature may be used in a feedback loop to control the electrical current applied to heater element 44 by power supply 43 such that the substrate temperature can be maintained or controlled at a desired temperature that is suitable for the particular process application. Optionally, pedestal 38 may be heated using radiant heat (not shown). A vacuum pump 48 is used to evacuate processing chamber 37 and to help maintain the proper gas flows and pressure inside processing chamber 37.

Referring to FIGS. 1 and 2, one or both of processing chambers 12 and 14, discussed above may operate to deposit refractory metal layers on the substrate employing sequential deposition techniques. One example of sequential deposition techniques in accordance with the present invention includes atomic layer deposition (ALD). The term "substrate" as used herein includes the substrate, such as semiconductor substrates and glass substrates, as well as layers formed thereover, such as dielectric layers (e.g., $SiO_2$) and barrier layers (e.g., titanium, titanium nitride and the like).

Figure 3:
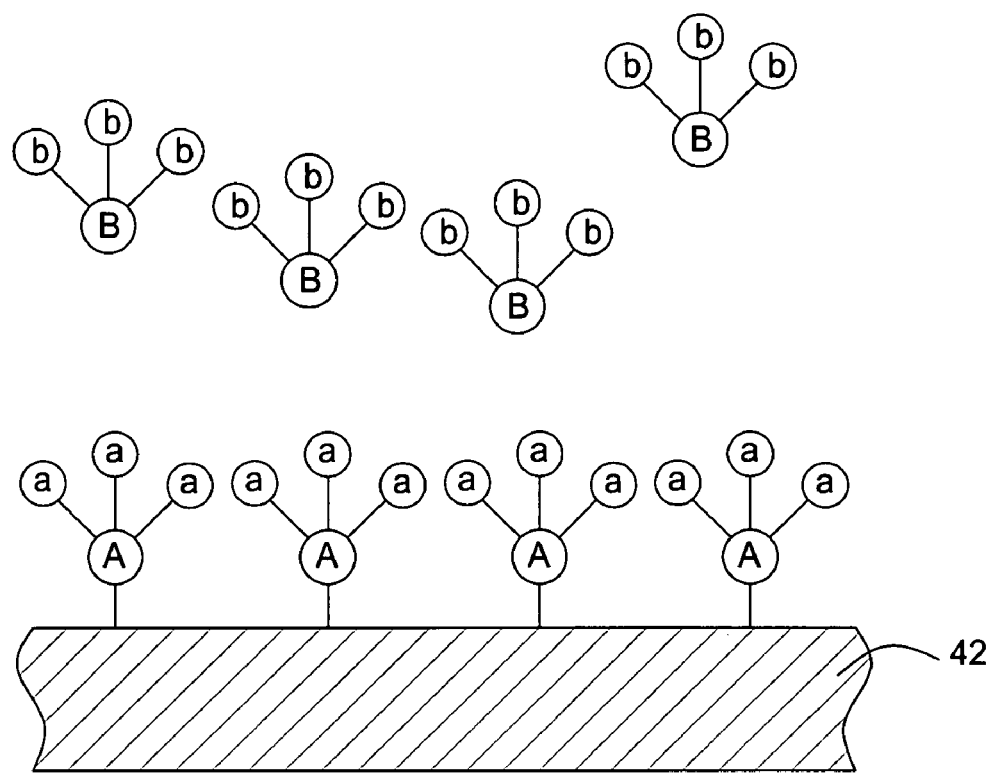
FIG. 3 is a schematic cross-sectional view of a substrate showing one possible mechanism of adsorption of a reductant over a substrate during sequential deposition.
Figure 4:
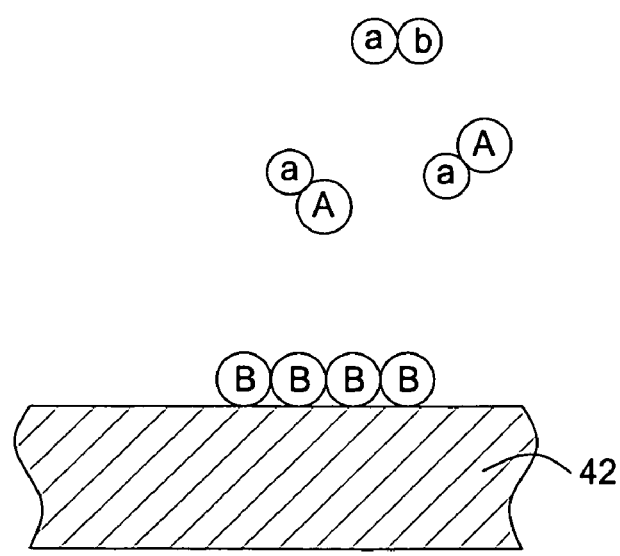
FIG. 4 is a schematic cross-sectional view of a substrate showing one possible mechanism of adsorption of a refractory metal containing compound over the substrate after introduction of the reductant.

Not wishing to be bound by theory, FIG. 3 is a schematic cross-sectional view of a substrate showing one possible mechanism of adsorption of a reductant over a substrate during sequential deposition. The terms "adsorption" or "adsorb" as used herein are defined to include chemisorption, physisorption, or any attractive and/or bonding forces which may be at work and/or which may contribute to the bonding, reaction, adherence, or occupation of a portion of an exposed surface of a substrate structure. During the sequential deposition technique, in accordance with the present invention, a batch of a first processing gas, in this case "$Aa_x$," results in a layer of "A" being deposited on substrate 42 having a surface of ligand "a" exposed to processing chamber 37. Layer "A" may be a monolayer, more than a monolayer, or less than a monolayer. Thereafter, a purge gas enters processing chamber 37 to purge gas "$Aa_x$," which has not been incorporated into the layer of A. FIG. 4 is a schematic cross-sectional view of a substrate showing one possible mechanism of adsorption of a refractory metal containing compound over the substrate after introduction of the reductant. After purging gas "$Aa_x$" from processing chamber 37, a second batch of processing gas, "$Bb_y$," is introduced into processing chamber 37. The "a" ligand present on the substrate surface reacts with the "b" ligand and "B" atom, releasing molecules, for example, "ab" and "aA," which move away from substrate 42 and are subsequently pumped from processing chamber 37. In this manner, a surface comprising a layer of B compound remains upon substrate 42 and exposed to processing chamber 37, shown in FIG. 4. The composition of the layer of B compound may be a monolayer or less of atoms typically formed employing ALD techniques. In other embodiments, more than a monolayer of B compound may be formed during each cycle. Alternatively, the layer of compound B may include a layer of multiple atoms (i.e., other atoms besides atoms of B). In such a case, the first batch and/or the second batch of processing gases may include a mixture of process gases, each of which has atoms that would adhere to substrate 42. The process proceeds cycle after cycle, until the desired thickness is achieved.

Referring to both FIGS. 3 and 4, although any type of processing gas may be employed, in the present example, the reductant "$Aa_x$" may comprise $B_2H_6$ or $PH_3$ and the refractory metal containing compound, $Bb_y$, may comprise $WF_6$. Some possible reactions are shown below in reference to chemical reaction (1) and chemical reaction (2).

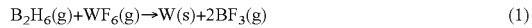

$$B_2H_6(g) + WF_6(g) \rightarrow W(s) + 2BF_3(g) \quad (1)$$

$$PH_3(g) + WF_6(g) \rightarrow W(s) + PF_3(g) \quad (2)$$

Other by-products include but are not limited to $H_2$, HF or $F_2$. Other reactions are also possible, such as decomposition reactions. In other embodiments, other reductants may be used, such as $SiH_4$. Similarly, in other embodiments, other tungsten containing gases may be used, such as $W(CO)_6$.

Figure 5:
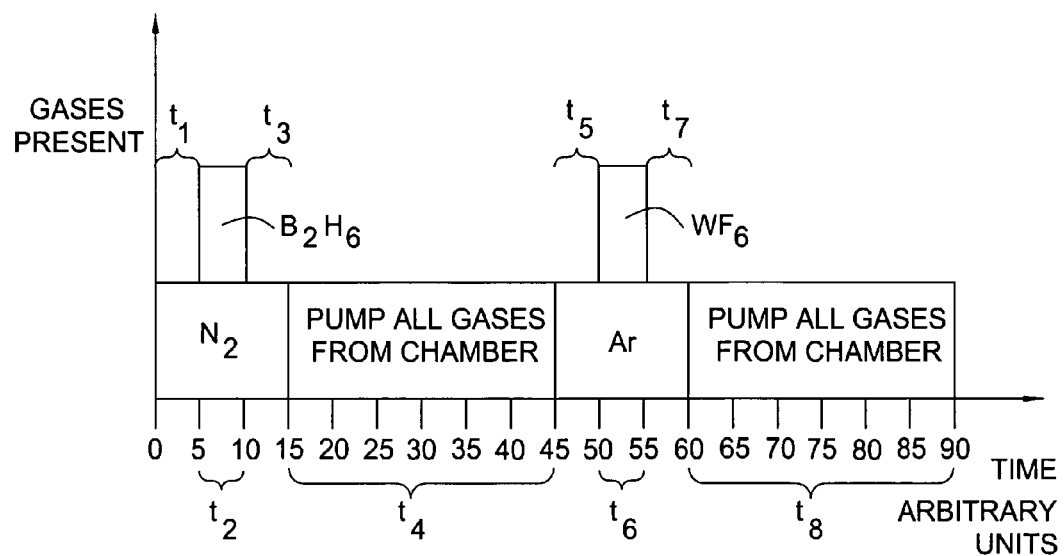
FIG. 5 is a graphical representation showing the concentration of gases present in a processing chamber, such as processing chamber as shown above in FIG. 2.

The purge gas includes Ar, He, $N_2$, $H_2$, other suitable gases, and combinations thereof. One or more purge gas may be used. FIG. 5 is a graphical representation of one embodiment of gases present in a processing chamber utilizing two purge gases Ar and $N_2$. Each of the processing gases was flowed into processing chamber 37 with a carrier gas, which in this example was one of the purge gases. $WF_6$ is introduced with Ar and $B_2H_6$ is introduced with $N_2$. It should be understood, however, that the purge gas may differ from the carrier gas, discussed more fully below. One cycle of the ALD technique in accordance with the present invention includes flowing the purge gas, $N_2$, into processing chamber 37 during time $t_1$, which is approximately about 0.01 seconds to about 15 seconds before $B_2H_6$ is flowed into processing chamber 37. During time $t_2$, the processing gas $B_2H_6$ is flowed into processing chamber 37 for a time in the range of about 0.01 seconds to about 15 seconds, along with a carrier gas, which in this example is $N_2$. After about 0.01 seconds to about 15 seconds have lapsed, the flow of $B_2H_6$ terminates and the flow of $N_2$ continues during time $t_3$ for an additional time in the range of about 0.01 seconds to about 15 seconds, purging the processing chamber of $B_2H_6$. During time $t_4$ which lasts approximately about 0 seconds to about 30 seconds, processing chamber 37 is pumped so as to remove most, if not all, gases. After pumping of process chamber 37, the carrier gas Ar is introduced for a time in the range of about 0.01 seconds to about 15 seconds during time $t_5$, after which time the process gas $WF_6$ is introduced into processing chamber 37, along with the carrier gas Ar during time $t_6$. The time $t_6$ lasts between about 0.01 seconds to about 15 seconds. The flow of the processing gas $WF_6$ into processing chamber 37 is terminated approximately about 0.01 seconds to about 15 seconds after it commenced. After the flow of $WF_6$ into processing chamber 37 terminates, the flow of Ar continues for an additional time in the range of 0.01 seconds to 15 seconds, during time $t_7$. Thereafter, processing chamber 37 is pumped so as to remove most, if not all, gases therein, during time $t_8$. As before, time $t_8$ lasts approximately about 0 seconds to about 30 seconds, thereby concluding one cycle of the sequential deposition technique, in accordance with the present invention. The cycle may be repeated to deposit a tungsten layer to a desired thickness.

The benefits of employing the sequential deposition technique are many fold, including flux-independence of layer formation that provides uniformity of deposition independent of the size of a substrate. For example, the measured difference of the layer uniformity and thickness measured between a 200 mm substrate and a 300 mm substrate deposited in the same chamber is negligible. This is due to the self-limiting characteristics of the sequential deposition techniques. Further, this technique contributes to improved step coverage over complex topography.

Figure 6:
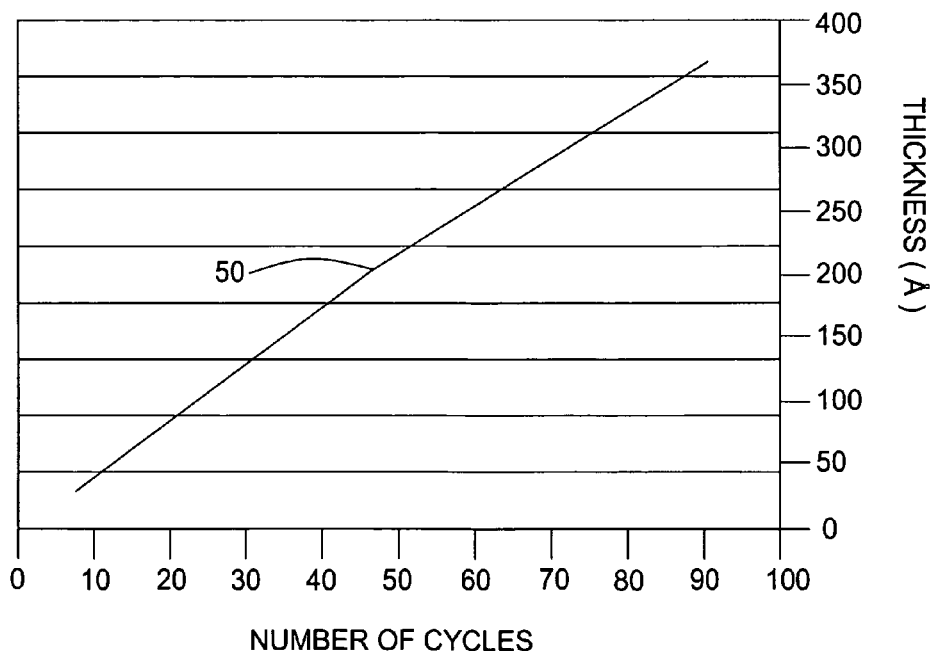
FIG. 6 is a graphical representation showing the relationship between the number of ALD cycles and the thickness of a layer formed on a substrate employing sequential deposition techniques, in accordance with the present invention.
Figure 7:
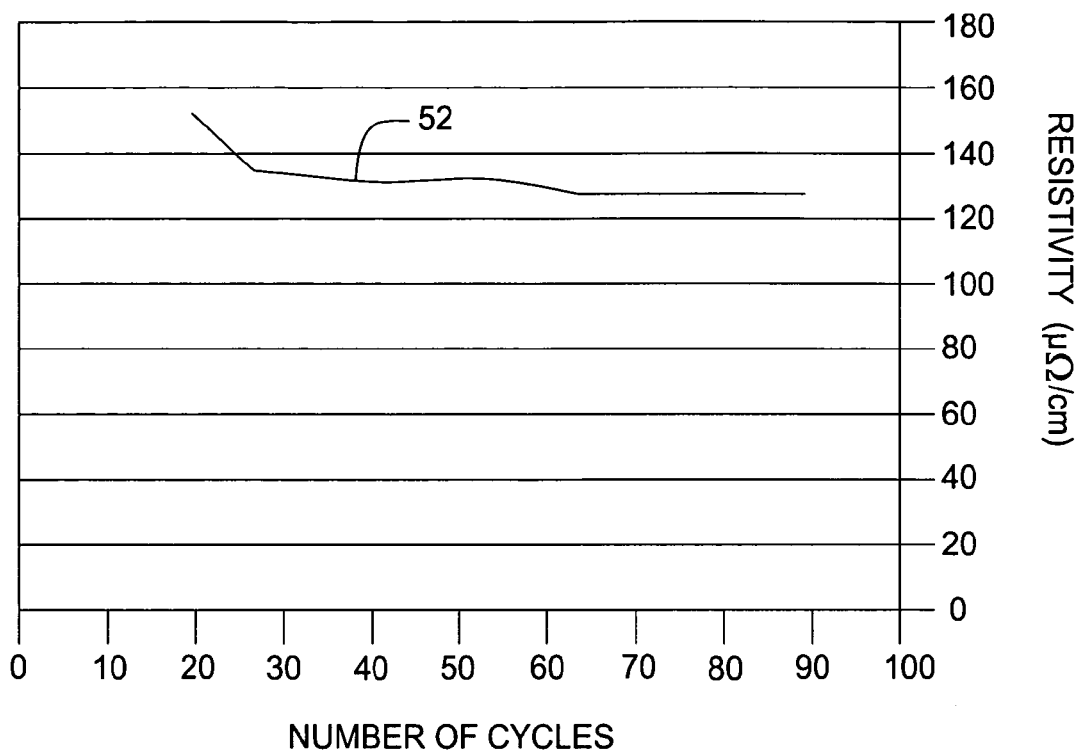
FIG. 7 is a graphical representation showing the relationship between the number of sequential deposition cycles and the resistivity of a layer formed on a substrate employing sequential deposition techniques, in accordance with the present invention.

In addition, the thickness of the layer B, shown in FIG. 4, may be easily controlled while minimizing the resistance of the same by employing sequential deposition techniques. With reference to FIG. 6, it is seen in the slope of line 50 that the thickness of the tungsten layer B is proportional to the number of cycles employed to form the same. The resistivity of the tungsten layer, however, is relatively independent of the thickness of the layer, as shown by the slope of line 52 in FIG. 7. Thus, employing sequential deposition techniques, the thickness of a refractory metal layer maybe easily controlled as a function of the cycling of the process gases introduced into the processing chamber with a negligible effect on the resistivity.

Figure 8:
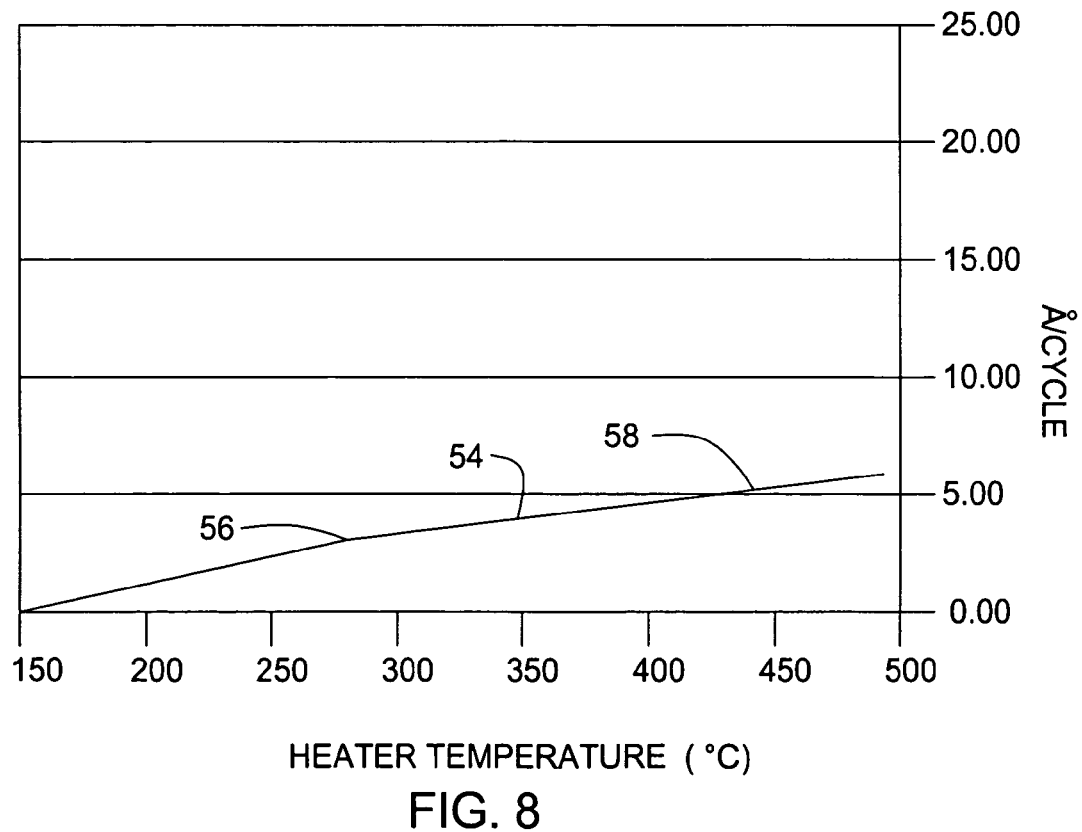
FIG. 8 is a graphical representation showing the relationship between the deposition rate of a layer formed on a substrate employing sequential deposition techniques and the temperature of the substrate.
Figure 9:
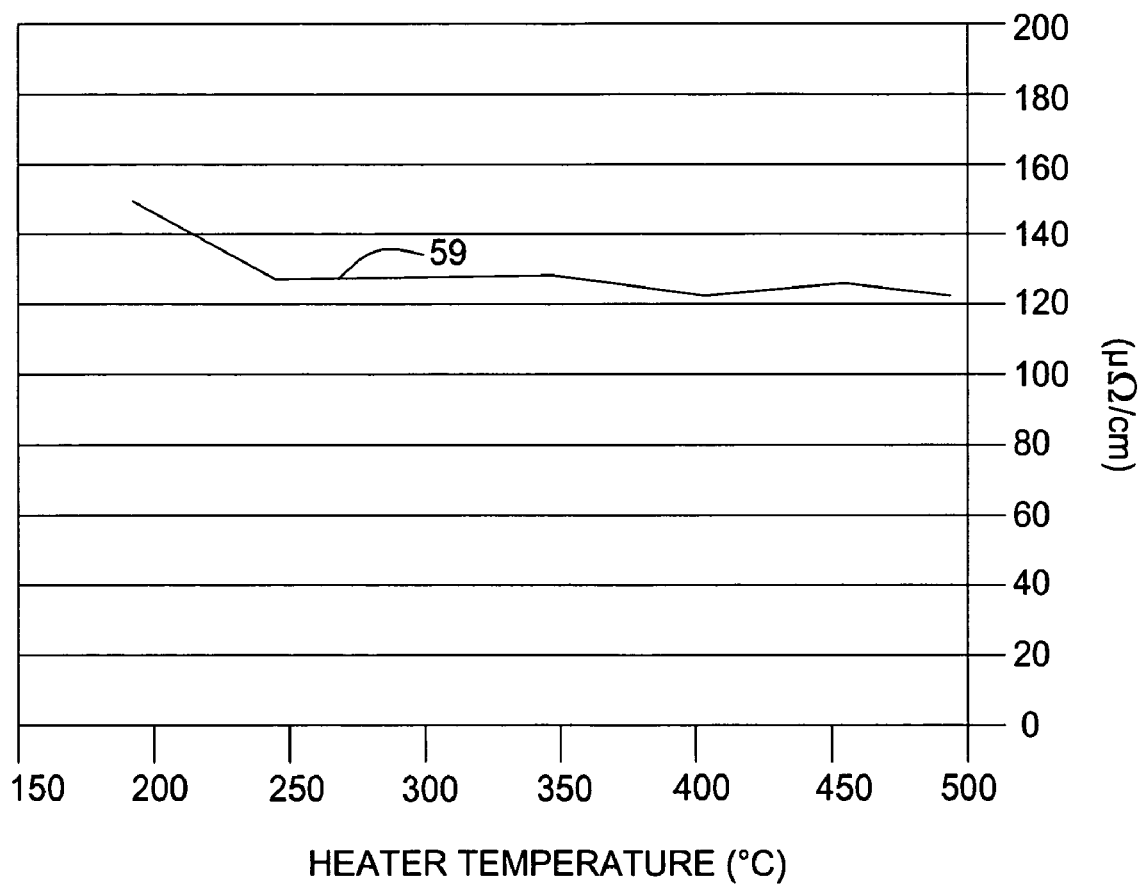
FIG. 9 is a graphical representation showing the relationship between the resistivity of a layer formed on a substrate employing sequential deposition techniques and the temperature of the substrate, in accordance with the present invention.

FIG. 8 is a graphical representation showing the relationship between the deposition rate of a layer formed on a substrate employing sequential deposition techniques and the temperature of the substrate. Control of the deposition rate was found to be dependent upon the temperature of substrate 42. As shown by the slope of line 54, increasing the temperature of substrate 42 increased the deposition rate of the tungsten layer B. The graph shows that less than a monolayer, a monolayer, or more than a monolayer of a tungsten layer may be formed depending on the substrate temperature utilized. For example, at 56, the deposition rate is shown to be approximately 2 Å/cycle at 250° C. However at point 58 the deposition rate is approximately 5 Å/cycle at a temperature of 450° C. The resistivity of the tungsten layer, however, is virtually independent of the layer thickness, as shown by the slope of curve 59, shown in FIG. 9. As a result, the deposition rate of the tungsten layer may be controlled as a function of temperature without compromising the resistivity of the same. However, it may be desirable to reduce the time necessary to deposit an entire layer of a refractory metal.

To that end, a bulk deposition of the refractory metal layer may be included in the deposition process. Typically, the bulk deposition of the refractory metal occurs after the nucleation layer is formed in a common processing chamber. Specifically, in the present example, nucleation of a tungsten layer occurs in chamber 12 employing the sequential deposition techniques discussed above, with substrate 42 being heated in the range of about 200° C. to about 400° C., and processing chamber 37 being pressurized in the range of about 1 Torr to about 10 Torr. A nucleation layer 60 of approximately about 120 Å to about 200 Å is formed on a patterned substrate 42, shown in FIG. 10. Nucleation layers of about 100 Å or less, about 50 Å or less, or about 25 Å or less have also been found to be effective in providing good step coverage over apertures having an aspect ratio of about 6:1 or greater. As shown, substrate 42 includes a barrier layer 61 and a patterned layer having a plurality of vias 63. The nucleation layer is formed adjacent to the patterned layer covering vias 63. As shown, forming nucleation layer 60 employing ALD techniques provides good step coverage. In another embodiment, sequential deposition techniques may be performed for both nucleation and bulk deposition. In still another embodiment, to decrease the time required to form a complete layer of tungsten, a bulk deposition of tungsten onto nucleation layer 60 occurs using CVD techniques, while substrate 42 is disposed in the same processing chamber 12, shown in FIG. 1. The bulk deposition may be performed using recipes well known in the art. In this manner, a tungsten layer 65 providing a complete plug fill is achieved on the patterned layer with vias having aspect ratios of approximately 6:1, shown in FIG. 11.

In an alternative embodiment, a bifurcated deposition process may be practiced in which nucleation of the refractory metal layer occurs in a chamber that is different from the chamber in which the remaining portion of the refractory metal layer is formed. Specifically, in the present example, nucleation of a tungsten layer occurs in chamber 12 employing the sequential deposition techniques, such as ALD, discussed above. To that end, substrate 42 is heated in the range of about 200° C. to about 400° C. and chamber 37 is pressurized in the range of about 1 Torr to about 10 Torr. A nucleation layer 60 of approximately 120 Å to 200 Å is formed on a patterned substrate 42, shown in FIG. 10. Nucleation layers of about 100 Å or less, about 50 Å or less, or about 25 Å or less have also been found to be effective in providing good step coverage over apertures having an aspect ratio of about 6:1 or greater. As shown, substrate 42 includes a barrier layer 61 and a patterned layer having a plurality of vias 63. The nucleation layer is formed adjacent to the patterned layer covering the vias 63. As shown, forming the nucleation layer 60 employing sequential deposition techniques provides improved step coverage.

In one embodiment, sequential deposition techniques are employed for bulk deposition of tungsten onto nucleation layer 60 occurs while substrate 42 is disposed in processing chamber 14, shown in FIG. 1. The bulk deposition maybe performed using recipes disclosed herein. In another embodiment, CVD techniques are employed for bulk deposition of tungsten onto nucleation layer 60 occurs while substrate 42 is disposed in processing chamber 14, shown in FIG. 1. The bulk deposition maybe performed using recipes well known in the art. Whether sequential deposition or CVD deposition techniques are employed, a tungsten layer 65 providing a complete plug fill is achieved on the patterned layer with vias having aspect ratios of approximately 6:1, shown in FIG. 11. Implementing the bifurcated deposition process discussed above may decrease the time required to form a tungsten layer having improved characteristics. Utilizing CVD deposition techniques for bulk deposition may further increase throughput.

Figure 12:
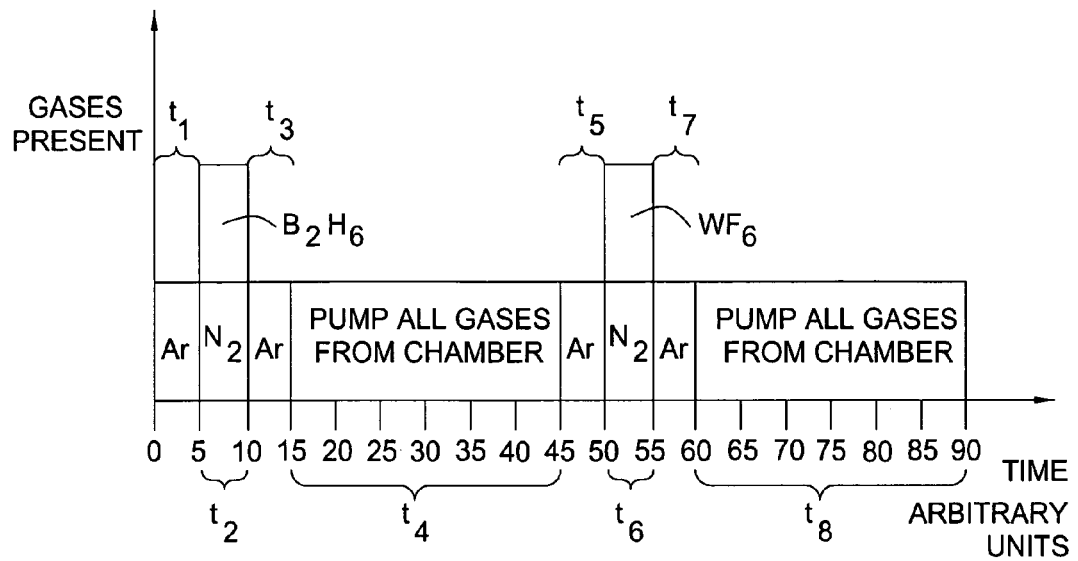
FIG. 12 is a graphical representation showing the concentration of gases present in a processing chamber, such as the processing chamber as shown above in FIG. 2, in accordance with an alternative embodiment of the present invention.
Figure 13:
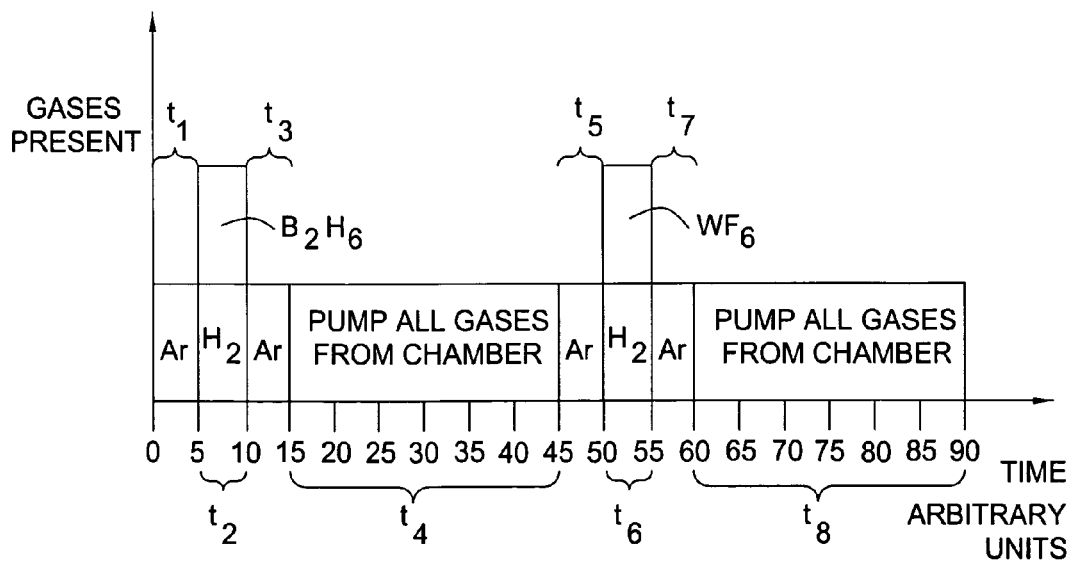
FIG. 13 is a graphical representation showing the concentration of gases present in a processing chamber, such as processing chamber as shown above in FIG. 2, in accordance with an alternative embodiment of the present invention.

As mentioned above, in an alternate embodiment of the present invention, the carrier gas may differ from the purge gas, as shown in FIG. 12. The purge gas, which is introduced at time intervals $t_1$, $t_3$, $t_5$ and $t_7$, comprises Ar. The carrier gas, which is introduced at time intervals $t_2$ and $t_6$, comprises of $N_2$. Thus, at time interval $t_2$ the gases introduced into the processing chamber include a mixture of $B_2H_6$ and $N_2$, and a time interval $t_6$, the gas mixture includes $WF_6$ and $N_2$. The pump process during time intervals $t_4$ and $t_8$ is identical to the pump process discussed above with respect to FIG. 5. In yet another embodiment, shown in FIG. 13, the carrier gas during time intervals $t_2$ and $t_6$ comprises $H_2$, with the purge gas introduced at time intervals $t_1$, $t_3$, $t_5$ and $t_7$ comprises Ar. The pump processes at time intervals $t_4$ and $t_8$ are as discussed above. As a result, at time interval $t_2$ the gas mixture introduced into processing chamber 37 comprises of $B_2H_6$ and $H_2$, and $WF_6$, and $H_2$ at time interval $t_6$.

Figure 10:
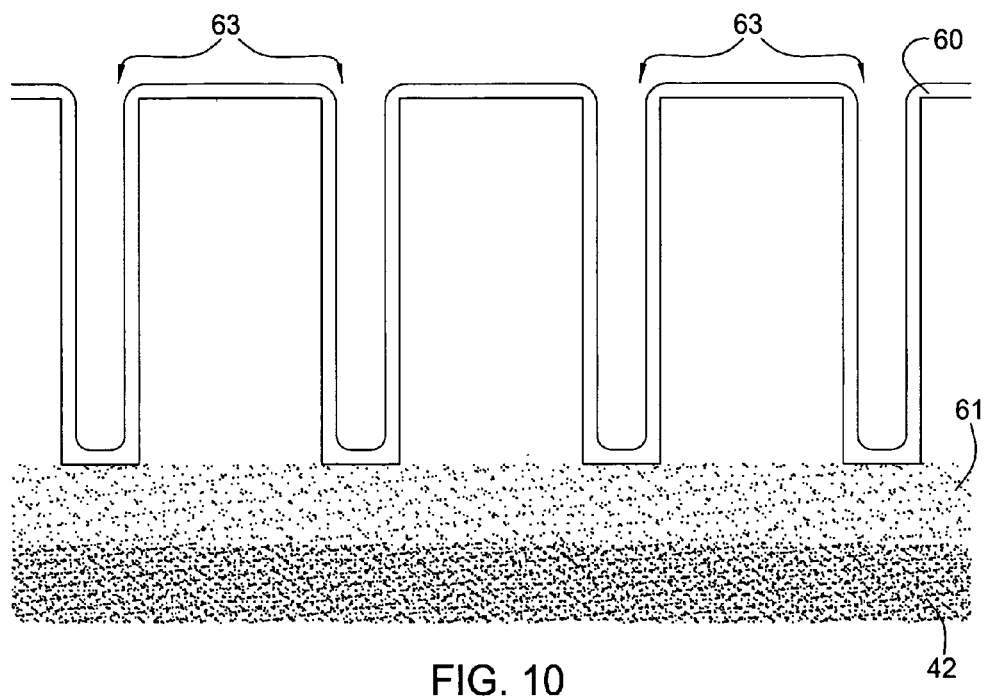
FIG. 10 is a schematic cross-sectional view of one embodiment of a patterned substrate having a nucleation layer formed thereon employing sequential deposition techniques, in accordance with the present invention.
Figure 11:
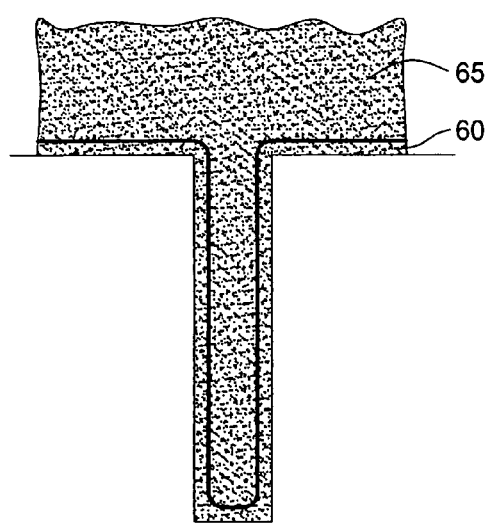
FIG. 11 is a schematic cross-sectional view of one embodiment of the substrate, shown above in FIG. 10, with a refractory metal layer formed atop of the nucleation layer employing CVD, in accordance with the present invention.

An advantage realized by employing the $H_2$ carrier gas is that the stability of the tungsten layer B may be improved. Specifically, by comparing curve 66 in FIG. 14 with curve 68 in FIG. 15, it is seen that the concentration of fluorine in the nucleation layer 60, shown in FIG. 10, is much less when $H_2$ is employed as the carrier gas, as compared with use of $N_2$ or Ar as a carrier gas.

Figure 14:
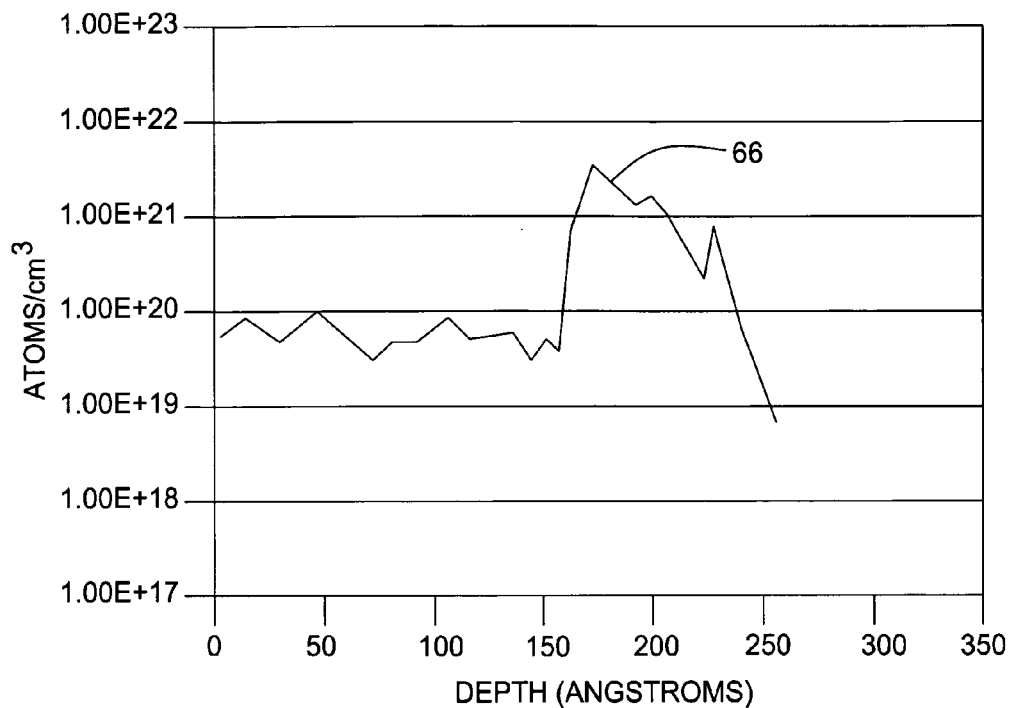
FIG. 14 is a graphical representation showing the fluorine content versus depth of a refractory metal layer formed on a substrate employing ALD, either Ar or $N_2$ being a carrier gas.
Figure 15:
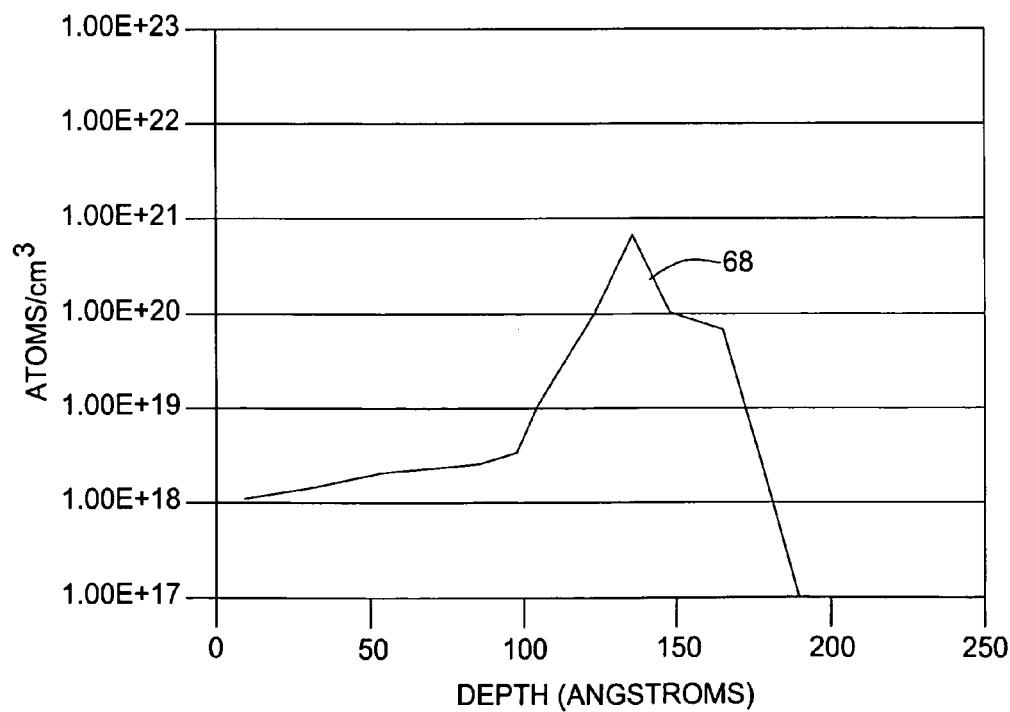
FIG. 15 is a graphical representation showing the fluorine content versus depth of a refractory metal layer formed on a substrate employing ALD with $H_2$ being a carrier gas.

Referring to both FIGS. 14 and 15, the apex and nadir of curve 66 show that the fluorine concentration reaches levels in excess of $1 \times 10^{21}$ atoms per cubic centimeter and only as low as just below $1 \times 10^{19}$ atoms per cubic centimeter. Curve 68, however, shows that the fluorine concentration is well below $1 \times 10^{21}$ atoms per cubic centimeter at the apex and well below $1 \times 10^{17}$ atoms per cubic centimeter at the nadir. Thus, employing $H_2$ as the carrier gas provides a much more stable film, e.g., the probability of fluorine diffusing into the substrate, or adjacent layer is reduced. This also reduces the resistance of the refractory metal layer by avoiding the formation of a metal fluoride that may result from the increased fluorine concentration. Thus, the stability of the nucleation layer, as well as the resistivity of the same, may be controlled as a function of the carrier gas employed. This is also true when a refractory metal layer is deposited entirely employing ALD techniques, i.e., without using other deposition techniques, such as CVD.

Figure 16:
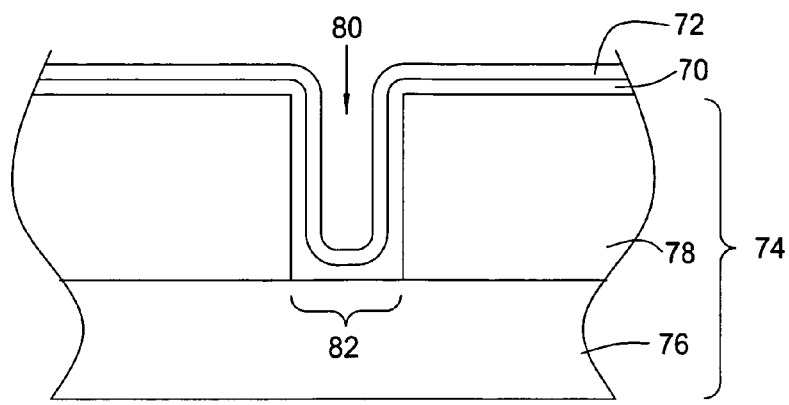
FIG. 16 is a schematic cross-sectional view of one embodiment of a substrate shown above in FIGS. 3 and 4 upon which a layer of either $PH_3$ or $B_2H_6$ is disposed between a substrate and a tungsten layer, in accordance with one embodiment of the present invention.

In addition, adsorbing a layer 70, shown in FIG. 16, of either $PH_3$ or $B_2H_6$ prior to introduction of the tungsten containing compound forms a tungsten layer 72 with reduced fluorine content, improved step coverage, and improved resistivity. This was found to be the case where the tungsten containing compound is introduced over a layer of $PH_3$ or $B_2H_6$ employing sequential deposition techniques or employing standard CVD techniques using either tungsten hexafluoride ($WF_6$) and silane ($SiH_4$) or tungsten hexafluoride ($WF_6$) and molecular hydrogen ($H_2$) chemistries. The improved characteristics of the tungsten film are believed to be attributable to the chemical affinity between the $PH_3$ or $B_2H_6$ layer and the $WF_6$ layer. This provides better surface mobility of the adsorbed chemical species and better reduction of $WF_6$ at the nucleation stage of the tungsten layer. This has proven beneficial when depositing a tungsten layer adjacent to a titanium containing adhesion layer formed from titanium (Ti) or titanium nitride (TiN). Layer 70 is preferably a monolayer, but in other embodiments may be less than or more than a monolayer. Layer 70 in the film stack, shown in FIG. 16, shows the formation of the tungsten layer 72. It is understood that layer 70 may or may not be consumed during formation of the tungsten layer 72. It is also understood that a plurality of layers 70 and tungsten layers 72 may be deposited to form a tungsten layer to a desired thickness. As shown, layer 70 is deposited on substrate 74 that includes a wafer 76 that may be formed from any material suitable for semiconductor processing, such as silicon. One or more layers, shown as layer 74, may be present on wafer 76. Layer 78 may be formed from any suitable material, included dielectric or conductive materials. Layer 78 includes a void 80, exposing a region 82 of wafer 76.

Figure 18:
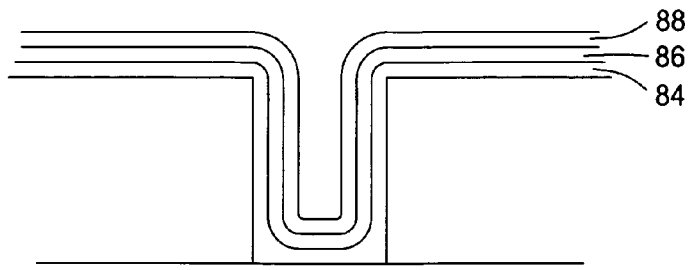
FIG. 18 is a schematic cross-sectional view of one embodiment of a substrate shown above in FIGS. 3 and 4 in which a titanium-containing layer is deposited between a substrate and a layer of either $PH_3$ or $B_2H_6$, in accordance with the present invention.

FIG. 18 is a detailed cross-sectional view of a substrate in which a titanium-containing adhesion layer is formed between a substrate and a layer of either $PH_3$ or $B_2H_6$ during the fabrication of a W layer adjacent to the titanium-containing adhesion layer. The titanium-containing adhesion layer may be formed employing standard CVD techniques. In one embodiment, the titanium-containing adhesion layer is formed employing sequential deposition techniques. To that end, processing gas $Aa_x$ is selected from the group including $H_2$, $B_2H_6$, $SiH_4$ and $NH_3$. Processing gas $Bb_y$ is a titanium-containing gas selected from the group that includes TDMAT, TDEAT and $TiCl_4$. Also, Ar and $N_2$ purge gases are preferably employed, although other purge gas may be used.

Figure 17:
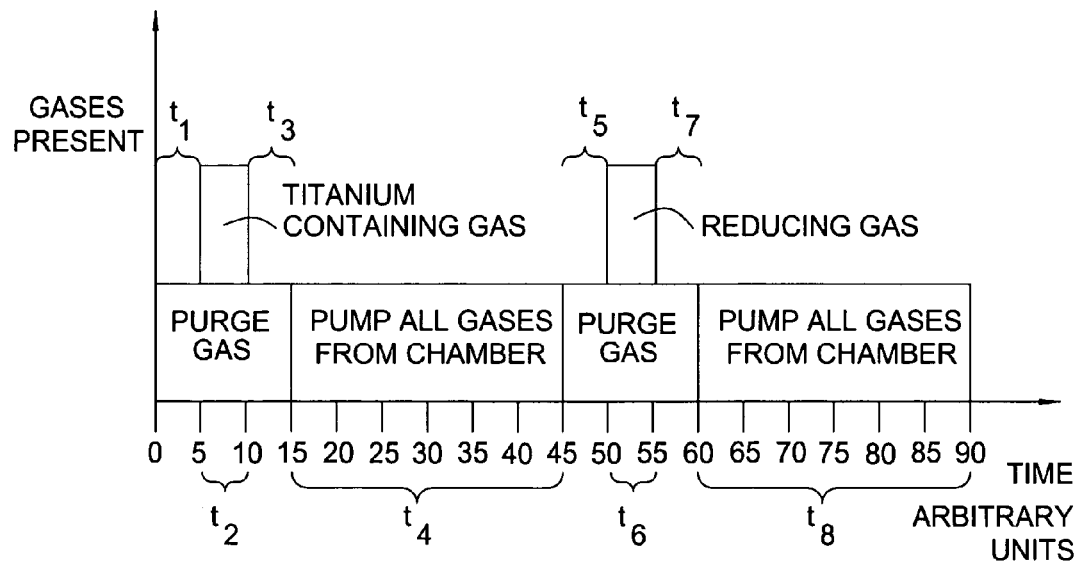
FIG. 17 is a graphical representation showing the concentration of gases present in a processing chamber, such as processing chamber as shown above in FIG. 2, in accordance with one embodiment of the present invention.

Referring to FIGS. 2 and 17, each of the processing gases is flowed into processing chamber 37 with a carrier gas, which in this example, is one of the purge gases. It should be understood, however, that the purge gas may differ from the carrier gas, discussed more fully below. One cycle of the sequential deposition technique, in accordance with the present invention, includes flowing a purge gas into processing chamber 37 during time $t_1$ before the titanium-containing gas is flowed into processing chamber 37. During time $t_2$, the titanium-containing processing gas is flowed into the processing chamber 37, along with a carrier gas. After $t_2$ has lapsed, the flow of titanium-containing gas terminates and the flow of the carrier gas continues during time $t_3$, purging the processing chamber of the titanium-containing processing gas. During time $t_4$, the processing chamber 37 is pumped so as to remove all gases. After pumping of process chamber 37, a carrier gas is introduced during time $t_5$, after which time the reducing process gas is introduced into the processing chamber 37 along with the carrier gas, during time $t_6$. The flow of the reducing process gas into processing chamber 37 is subsequently terminated. After the flow of reducing process gas into processing chamber 37 terminates, the flow of carrier gas continues, during time $t_7$. Thereafter, processing chamber 37 is pumped so as to remove all gases therein, during time $t_8$, thereby concluding one cycle of the sequential deposition technique in accordance with the present invention. The aforementioned cycle is repeated multiple times until titanium-containing layer reaches a desired thickness. For example, in reference to FIG. 18, after TiN layer 84 reaches a desired thickness, layer 86, in this example formed from $PH_3$ or $B_2H_6$, is deposited adjacent thereto employing sequential deposition techniques, as discussed above. Thereafter, a layer of tungsten 88, shown in FIG. 18, is disposed adjacent to layer 86 using the sequential deposition technique or standard CVD techniques, both of which are discussed above. Layer 86 is preferably a monolayer, but in other embodiments may be less than or more than a monolayer. Layer 86 in the film stack, shown in FIG. 18, shows the formation of the tungsten layer 88. It is understood that layer 86 may or may not be consumed during formation of the tungsten layer 88. It is also understood that a plurality of layers 86 and tungsten layers 88 may be deposited to form a tungsten layer to a desired thickness. If desired, a copper layer maybe deposited atop of tungsten layer 88. In this manner, tungsten may function as a barrier layer.

Referring again to FIG. 2, the process for depositing the tungsten layer may be controlled using a computer program product that is executed by controller 22. To that end, controller 22 includes a central processing unit (CPU) 90, a volatile memory, such as a random access memory (RAM) 92 and permanent storage media, such as a floppy disk drive for use with a floppy diskette or hard disk drive 94. The computer program code can be written in any conventional computer readable programming language; for example, 68000 assembly language, C, C++, Pascal, FORTRAN and the like. Suitable program code is entered into a single file, or multiple files, using a conventional text editor and stored or embodied in a computer-readable medium, such as hard disk drive 94. If the entered code text is in a high level language, the code is compiled and the resultant compiler code is then linked with an object code of precompiled Windowse® library routines. To execute the linked and compiled object code, the system user invokes the object code, causing the CPU 90 to load the code in RAM 92. The CPU 90 then reads and executes the code to perform the tasks identified in the program.

Although the invention has been described in terms of specific embodiments, one skilled in the art will recognize that various changes to the reaction conditions, e.g., temperature, pressure, film thickness and the like can be substituted and are meant to be included herein. Additionally, while the bifurcated deposition process has been described as occurring in a common system, the bulk deposition may occur in a processing chamber of a mainframe deposition system that is different from the mainframe deposition system in which the processing chamber is located that is employed to deposit the nucleation layer. Finally, other refractory metals may be deposited, in addition to tungsten, and other deposition techniques may be employed in lieu of CVD. For example, physical vapor deposition (PVD) techniques, or a combination of both CVD and PVD techniques may be employed. The scope of the invention should not be based upon the foregoing description. Rather, the scope of the invention should be determined based upon the claims recited herein, including the full scope of equivalents thereof.

The invention claimed is:

1. A method for forming a tungsten-containing material on a substrate, comprising:

positioning a substrate containing a barrier layer disposed thereon within a process chamber;

exposing the substrate to a first reagent to form a first reagent layer on the barrier layer;

exposing the substrate sequentially to a tungsten precursor and a reductant to form a nucleation layer thereon;
exposing the substrate to a second reagent to form a second reagent layer on the nucleation layer; and
depositing a bulk layer over the nucleation layer.

2. The method of claim 1, wherein the barrier layer is deposited by a vapor deposition process selected from the group consisting of an ALD process, a CVD process, a PVD process, and derivatives thereof.

3. The method of claim 2, wherein the barrier layer comprises titanium or titanium nitride.

4. The method of claim 3, wherein the vapor deposition process comprises exposing the substrate to a titanium precursor selected from the group consisting of TDMAT, TDEAT, titanium tetrachloride, and derivatives thereof, and a reagent selected from the group consisting of ammonia, hydrogen, diborane, silane, derivatives thereof, and combinations thereof.

5. The method of claim 1, wherein the first reagent is a first reducing agent and the second reagent is a second reducing agent.

6. The method of claim 5, wherein the first reducing agent and the second reducing agent are independently selected from the group consisting of diborane, phosphine, silane, derivatives thereof, and combinations thereof.

7. The method of claim 6, wherein the first reducing agent and the second reducing agent are the same reducing agent.

8. The method of claim 6, wherein the first reducing agent and the second reducing agent are different reducing agents.

9. The method of claim 5, wherein the reductant comprises a compound selected from the group consisting of phosphine, diborane, silane, hydrogen, derivatives thereof, and combinations thereof.

10. The method of claim 9, wherein the tungsten precursor is tungsten hexafluoride and the reductant is silane or diborane.

11. The method of claim 10, wherein the nucleation layer has a thickness of about 100 Å or less.

12. The method of claim 5, wherein the bulk layer comprises tungsten and is deposited by a vapor deposition process selected from the group consisting of an ALD process, a CVD process, a PVD process, and derivatives thereof.

13. The method of claim 12, wherein the vapor deposition process comprises exposing the substrate to tungsten hexafluoride and silane or to tungsten hexafluoride and hydrogen.

14. The method of claim 5, wherein the bulk layer comprises copper.

15. The method of claim 12, wherein hydrogen gas is co-flowed with the tungsten precursor.

16. The method of claim 15, where in a tungsten-containing material is formed having a fluorine concentration of less than about $1\times10^{17}$ atoms/cm$^3$.

17. A method for forming a tungsten-containing material on a substrate, comprising:
positioning a substrate containing at least one aperture within a process chamber;
exposing the substrate to a first reagent to form a first reagent layer thereon prior to forming a nucleation layer;
exposing the substrate sequentially to a reductant and a tungsten precursor to form the nucleation layer within the at least one aperture during an ALD process;
exposing the nucleation layer to a second reagent to form a second reagent layer before depositing the tungsten-containing bulk layer thereon; and
forming a tungsten-containing bulk layer over the nucleation layer to fill the at least one aperture during a CVD process.

18. The method of claim 17, wherein the at least one aperture comprises a barrier layer.

19. The method of claim 18, wherein the barrier layer comprises titanium or titanium nitride.

20. The method of claim 18, wherein the barrier layer is exposed to the first reagent to form the first reagent layer thereon.

21. The method of claim 20, wherein the reductant comprises a compound selected from the group consisting of phosphine, diborane, silane, hydrogen, derivatives thereof, and combinations thereof.

22. The method of claim 21, wherein the tungsten precursor is tungsten hexafluoride and the reductant is silane or diborane.

23. The method of claim 17, wherein the nucleation layer is exposed to a second reagent to form a second reagent layer before depositing the tungsten-containing bulk layer thereon.

24. The method of claim 23, wherein the second reagent is selected from the group consisting of diborane, phosphine, silane, derivatives thereof, and combinations thereof.

25. The method of claim 23, wherein the second reagent is diborane or phosphine.

26. The method of claim 17, wherein the first reagent is a first reducing agent and the second reagent is a second reducing agent.

27. The method of claim 26, wherein the first reducing agent and the second reducing agent are the same reducing agent.

28. The method of claim 26, wherein the first reducing agent and the second reducing agent are different reducing agents.

29. The method of claim 26, wherein the tungsten-containing bulk layer is deposited by a vapor deposition process comprising exposing the substrate to tungsten hexafluoride and silane or to tungsten hexafluoride and hydrogen.

30. A method for forming a tungsten-containing material on a substrate, comprising:
exposing a substrate to a first reagent to form a first reagent layer thereon, wherein the first reagent comprises diborane or phosphine; and
exposing the substrate sequentially to a tungsten precursor and a reductant to form a nucleation layer thereon, wherein the reductant comprises silane.

31. The method of claim 30, wherein the first reagent layer is formed on a barrier layer contained on the substrate.

32. The method of claim 31, wherein the barrier layer comprises titanium or titanium nitride.

33. The method of claim 30, wherein a bulk layer is deposited over the nucleation layer.

34. The method of claim 33, wherein the bulk layer comprises tungsten and is deposited by a vapor deposition process.

35. The method of claim 34, wherein a second reducing agent is exposed to the nucleation layer before depositing the bulk layer.

36. A method for forming a metal-containing material on a substrate, comprising:
positioning a substrate containing a barrier layer disposed thereon within a process chamber;
exposing the substrate to a first reductant to form a first reductant layer thereon;

exposing the substrate sequentially to a metal precursor and a compound selected from the group consisting of phosphine, diborane, silane, hydrogen, derivatives thereof, and combinations thereof to form a nucleation layer thereon;

exposing the substrate to a second reductant to form a second reductant layer thereon; and depositing a bulk layer over the nucleation layer.

37. The method of claim 36, wherein the metal precursor is a tungsten precursor.

38. The method of claim 37, wherein the first and second reductants are independently selected from the group consisting of diborane, phosphine, silane, derivatives thereof, and combinations thereof.

39. A method for forming a metal-containing material on a substrate, comprising:

positioning a substrate comprising a plurality of apertures within a process chamber, wherein the substrate further comprises a barrier layer disposed within the apertures;

exposing the substrate to a reagent to form a reagent layer on the barrier layer, wherein the reagent comprises diborane or phosphine;

exposing the substrate sequentially to a reductant and a metal precursor to form a nucleation layer on the barrier layer within the apertures, wherein the reductant comprises silane; and filling the apertures with a conducting material.

40. A method for forming a metal-containing material on a substrate, comprising:

positioning a substrate comprising a plurality of apertures within a process chamber, wherein the substrate further comprises a barrier layer disposed within the apertures;

exposing the substrate sequentially to a reductant and a metal precursor to form a nucleation layer on the barrier layer within the apertures, wherein the reductant comprises silane;

exposing the substrate to a reagent to form a reagent layer on the nucleation layer, wherein the reagent comprises diborane or phosphine; and filling the apertures with a conducting material.

41. A method for forming a tungsten-containing material on a substrate, comprising:

positioning a substrate comprising a plurality of apertures within a process chamber, wherein the apertures comprises a barrier layer and have an aspect ratio of about 6 or higher;

exposing the substrate to a first reagent to form a first reagent layer thereon prior to forming a nucleation layer;

exposing the substrate sequentially to a reductant and a tungsten precursor to form the nucleation layer within the apertures during an ALD process;

exposing the substrate to a second reagent to form a second reagent layer thereon prior to forming a tungsten-containing bulk layer; and forming the tungsten-containing bulk layer over the nucleation layer to fill the apertures during a CVD process.

42. The method of claim 41, wherein the barrier layer comprises titanium or titanium nitride.

43. The method of claim 41, wherein the reductant comprises a compound selected from the group consisting of phosphine, diborane, silane, hydrogen, derivatives thereof, and combinations thereof.

44. The method of claim 43, wherein the tungsten precursor is tungsten hexafluoride and the reductant is silane or diborane.

45. The method of claim 43, wherein the second reagent is selected from the group consisting of diborane, phosphine, silane, derivatives thereof, and combinations thereof.

46. The method of claim 43, wherein the second reagent is diborane or phosphine.

47. The method of claim 39, wherein the nucleation layer comprises tungsten and is deposited during an ALD process.

48. The method of claim 47, wherein the conducting material comprises tungsten and is deposited into the apertures by a CVD process.

49. The method of claim 48, wherein the ALD process and the CVD process are conducted in the same process chamber.

* * * * *

UNITED STATES PATENT AND TRADEMARK OFFICE
CERTIFICATE OF CORRECTION

PATENT NO.        : 7,238,552 B2  
APPLICATION NO.   : 11/130515  
DATED             : July 3, 2007  
INVENTOR(S)       : Jeong Soo Byun Page 1 of 1

It is certified that error appears in the above-identified patent and that said Letters Patent is hereby corrected as shown below:

In Column 2, Line 42, please delete "layer formed" and insert --layer is formed--;
In Column 3, Line 55, please delete "such as processing" and insert --such as the processing--;
In Column 4, Line 5, please delete "such as processing" and insert --such as the processing--;
In Column 4, Line 41, please delete "39*b*" and insert --39*b*,--;
In Column 4, Line 44, please delete "39*b*" and insert --39*b*,--;
In Column 4, Line 66, please delete "above" and insert --above,--;
In Column 8, Line 22, please delete "$t_5$" and insert --$t_5$,--;
In Column 8, Line 31, please delete "$t_5$" and insert --$t_5$,--;
In Column 8, Line 41, please delete "with use" and insert --with the use--;
In Column 9, Line 43, please delete "example," and insert --example--;
In Column 10, Line 1, please delete "until titanium-containing" and insert --until the titanium-containing--;
In Column 10, Line 36, please delete "Windowse®" and insert --Windows®--;
In Column 10, Line 44, please delete "thickness" and insert --thickness,--.

In the Claims:
In Column 11, Claim 16, Line 1, please delete "where in" and insert --wherein--.

Signed and Sealed this

Twenty-eighth Day of August, 2007

JON W. DUDAS  
*Director of the United States Patent and Trademark Office*